United States Patent [19]

Hinsberg, III et al.

[11] Patent Number: 4,767,723
[45] Date of Patent: Aug. 30, 1988

[54] PROCESS FOR MAKING SELF-ALIGNING THIN FILM TRANSISTORS

[75] Inventors: William D. Hinsberg, III, Fremont, Calif.; Webster E. Howard, Yorktown Heights, N.Y.; Carlton G. Willson, San Jose, Calif.

[73] Assignee: International Business Machines Corporation, Armonk, N.Y.

[21] Appl. No.: 115,470

[22] Filed: Oct. 30, 1987

[51] Int. Cl.[4] ............... H01L 21/265; H01L 21/465; H01L 21/44; H01L 21/48
[52] U.S. Cl. ..................... 437/41; 437/228; 437/229; 437/909; 437/181; 148/DIG. 137; 357/23.7; 430/312
[58] Field of Search ............... 437/41, 228, 229, 909, 437/181; 148/DIG. 137; 430/312; 357/23.7

[56] References Cited

U.S. PATENT DOCUMENTS 4,599,246 7/1986 Harajira et al. .................. 437/234
4,700,458 10/1987 Suzuki et al. ..................... 437/41

FOREIGN PATENT DOCUMENTS 0090661 10/1983 European Pat. Off. .
3337315 10/1982 Fed. Rep. of Germany .

OTHER PUBLICATIONS

T. Kodama et al, "A Self-Alignment Process for Amorphous Silicon Thin Film Transistors", IEEE Electron Device Ltrs., vol. EDL-3, No. 7, Jul. 1982, pp. 187-189.

Primary Examiner—Brian E. Hearn
Assistant Examiner—M. Wilczewski
Attorney, Agent, or Firm—Joseph G. Walsh

[57] ABSTRACT

A process for making a self-aligned thin film transistor, said process comprising the steps of: (1) providing a gate which comprises a glass substrate, a transparent electrode on top thereof, and a metal electrode on top of said transparent electrode, (2) forming a stack by depositing over said gate a triple layer structure consisting of gate dielectric material, active material and a top passivating dielectric, (3) coating the top of said triple layer with a dual-tone photoresist, (4) exposing said photoresist from the top through a mask having transparent areas, opaque areas and areas transparent to selective wavelengths, using broad band UV light, (5) developing the photoresist by treatment with a solvent, (6) etching the stack with a liquid etchant through to the glass substrate, (7) exposing the photoresist from the bottom through the glass substrate using near UV light, (8) developing the photoresist with a solvent, and (9) etching off the top passivating layer of the stack.

3 Claims, 2 Drawing Sheets

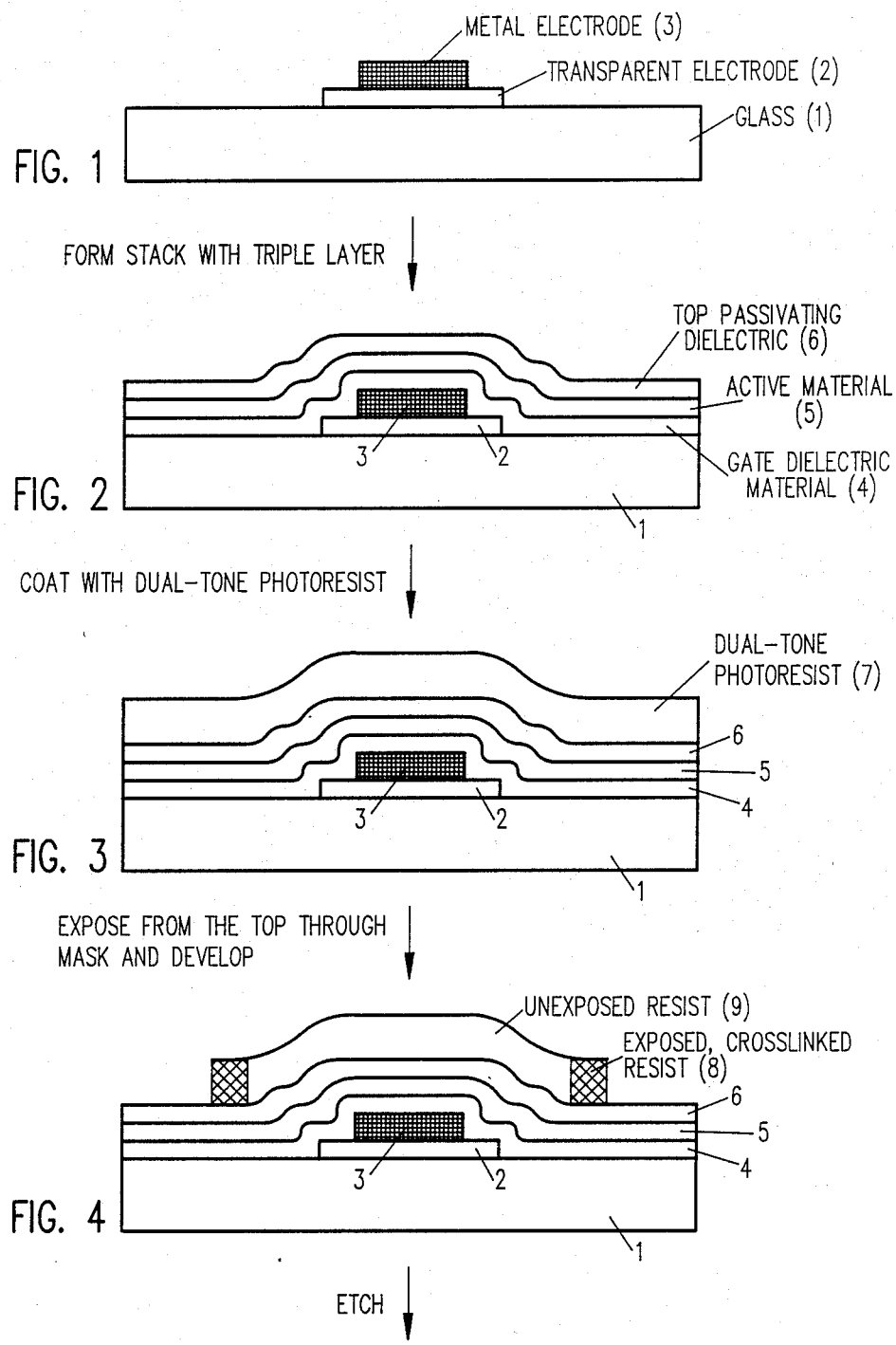

EXPOSE FROM BOTTOM THROUGH
GLASS SUBSTRATE AND DEVELOP

ETCH OFF TOP PASSIVATING LAYER

PROCESS FOR MAKING SELF-ALIGNING THIN FILM TRANSISTORS

TECHNICAL FIELD

The present invention is concerned with a process for making self-aligned thin film transistors. The process has the advantages of requiring only three mask exposures and resulting in self-alignment.

BACKGROUND ART

U.S. Pat. No. 4,599,246 shows a process for producing a thin film transistor array. The process requires three masking steps instead of the conventional seven. The process of the patent differs from the present invention, however, in that it is not self-aligning and does not involve the use of a dual-tone resist.

An article by Kodama et al in IEEE Electron Device Letters, Vol. EDL-3, #7, July 1982, page 187, shows a self-aligning process for thin film transistors. The process of this publication does not involve the use of a dual-tone resist and it is also obviously different from the process of the present invention.

West German patent application DE No. 3337315 Al discloses the concept of a dual-tone resist. The publication, however, is entirely silent in regard to a process for making a thin film transistor and does not describe a self-aligning process.

SUMMARY OF THE INVENTION

According to the present invention, by using a dual-tone resist, it is possible to manufacture a thin film transistor which is self-aligned. The process of the present invention has the advantage of reducing the number of required steps. Furthermore, the most critical alignment is achieved automatically regardless of small changes in the size of the glass from step-to-step, for example. Both these advantages serve to lower cost by improving yield and by reducing the number of alignment tools.

An understanding of the process of the present invention will be facilitated by reference to the accompanying drawings.

BRIEF DESCRIPTION OF THE DRAWINGS

FIG. 1 through FIG. 7, inclusive, are cross-sections, not to scale, of the device during the steps of its manufacture according to the process of the present invention.

DETAILED DESCRIPTION OF THE INVENTION

Figure 5:
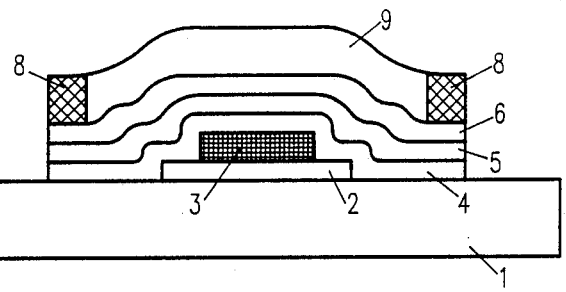
Figure 6:
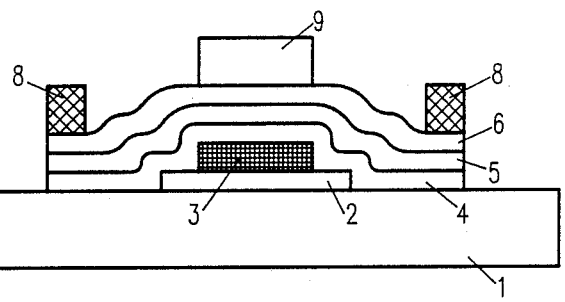
Figure 7:
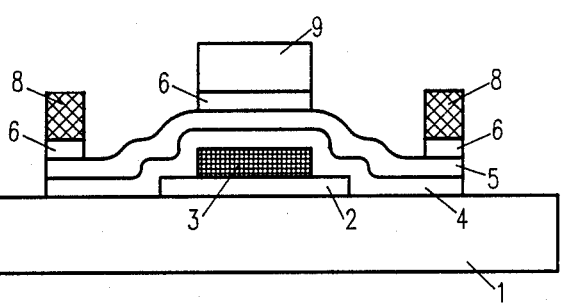

FIG. 1 shows the starting material of the present invention, namely a gate which comprises a glass substrate (1), a transparent electrode (2), and a metal electrode (3). In the first step of the process of the present invention, a stack is formed by coating the gate with a triple layer. As is shown in FIG. 2, this triple layer consists of a gate dielectric material (4), active metal (5) and top passivation dielectric (6). This stack is next coated with a dual-tone photoresist which is shown in FIG. 3 as (7). In the next step of the process, the dual-tone photoresist (7) is exposed from the top through a mask having three types of area: (a) opaque areas, (b) areas transparent to selected wavelengths and (c) transparent areas. The exposure is done from the top using broad band UV light, and following the exposure, development takes place using a solvent. This results in the structure shown in FIG. 4 where the side portions of the original dual-tone photoresist have been completely removed. Another portion remains as exposed cross-linked resist (8) and still another portion remains as unexposed resist (9). The stack is next etched with a liquid etchant through to the glass substrate thereby producing the structure shown in FIG. 5. The structure of FIG. 5 is then exposed from the bottom through the glass substrate using near UV light and developed with a solvent to produce the structure shown in FIG. 6. It will be noticed that FIG. 6 differs from FIG. 5 in that the unexposed resist (9) has been removed except for that area above the metal electrode. Finally, th stack is subjected to an etching step to remove the top passivating layer, thereby producing the finished thin film transistor structure shown in FIG. 7.

In summary, according the process of the present invention, a self-aligned thin film transistor is produced by the steps of (1) providing a gate which comprises a glass substrate, a transparent electrode on top thereof and a metal electrode on top of said transparent electrode, (2) forming a stack by depositing over said gate a triple layer structure consisting of gate dielectric metal, active material and a top passivating dielectric, (3) coating the top of said triple layer with a dual-tone photoresist, (4) exposing said photoresist from the top through a mask having transparent areas, opaque areas, and areas transparent to selective wavelengths, using broad band UV light, (5) developing the photoresist by treatment with a solvent, (6) etching the stack with a liquid etchant through to the glass substrate, (7) exposing the photoresist from the bottom through the glass substrate using near UV light, (8) developing the photoresist with a solvent, and (9) etching off the top passivating layer of the stack.

This process results in having the active layer in a geometry which is registered or self-aligned to the underlying metal, and since the metal is registered to the edge of the transparent portion of the gate, the contact has a controlled overlay (e.g. 3 $\mu$m) with respect to the gate electrode. It is of particular advantage of the present invention that it allows control of this overlap of the gate electrode.

The concept of a dual-tone resist has already been reported in the art. The expression "dual-tone resist" is used here in its ordinary meaning to refer to a resist composition having a matrix resin and at least two photoactive additives, one of which causes acceleration of dissolution upon radiation and one of which causes deceleration of dissolution upon radiation. For the purposes of the present invention, one such dual-tone resist compositions which is preferred comprises a matrix resin which is a phenol-formaldehyde resin. Another suitable matrix resin is poly(p-hydroxystyrene). Useful accelerating photoadditives include diazoquinones, such as 4- or 5-sulfonate esters of 1-oxo-2-diazonaphthoquinone sulfonic acids. The preferred photoactive additives that decelerate resist dissolution upon activation are mono- or bis-aryl azides including diazidodiphenyl sulfones, bis-(azidobenzylidene) cyclohexanones and azidochalcones.

In a preferred variation of the present invention, the compositions employed are made sensitive to various wavelengths of UV light. For example, the additive that brings about acceleration of resist dissolution upon activation can be diazonaphthoquinone sulfonate esters that absorb at wavelengths up to 400–500 nanometers. The decelerating additive can be mono- or bis-azides that do not absorb at wavelengths above 320 nanometers. The mask can be fabricated on a quartz substrate that transmits all wavelengths above 200 nanometers. The opaque mask elements can be chromium that is opaque to all activating wavelengths. The optical filter elements can be films of a common positive diazonaphthoquinone-novolac photoresist such as those commonly used in microcircuit fabrication, which transmit above 350 nanometers and are opaque below 350 nanometers at thicknesses greater than 3 microns.

As examples of other preferred materials for use in the process of the present invention, the following may be mentioned. The developing solvent can be an aqueous alkaline solution of an alkali hydroxide, such as sodium hydroxide. The transparent electrode is conveniently made of indium tin oxide and the metal electrode of molybdenum. Silicon nitride serves as a good material for the gate dielectric material, with amorphouse silicon as the active metal, and silicon nitride as the passivation dielectric material. A useful etchant for the passivation layer is phosphoric acid. A useful etchant for the indium tin oxide and molybdenum is a mixture of nitric and hydrochloric acids.

We claim:

1. A process for making a self-aligned thin film transistor, said process comprising the steps of:
   (1) providing a gate which comprises a glass substrate, a transparent electrode on top thereof, and a metal electrode on top of said transparent electrode,
   (2) forming a stack by depositing over said gate a triple layer structure consisting of gate dielectric material, active material and a top passivating dielectric,
   (3) coating the top of said triple layer with a dual-tone photoresist,
   (4) exposing said photoresist from the top through a mask having transparent areas, opaque areas and areas transparent to selective wavelengths, using broad band UV light,
   (5) developing the photoresist by treatment with a solvent,
   (6) etching the stack with a liquid etchant through to the glass substrate,
   (7) exposing the photoresist from the bottom through the glass substrate using near-UV light,
   (8) developing the photoresist with a solvent, and
   (9) etching off the top passivating layer of the stack.

2. A process as claimed in claim 1 wherein the dual-tone photoresist comprises a phenol-formaldehyde-type matrix resin, an accelerating photoactive additive which is a diazoquinone, and a decelerating photoactive additive which is a mono- or bis-aryl azide.

3. A process as claimed in claim 1 wherein the mask is a chromium-on-quartz photomask having certain transparent areas which transmit mid-UV light and other transparent areas which transmit only near-UV light.

* * * * *